United States Patent
Choobineh et al.

(10) Patent No.: US 11,876,036 B2
(45) Date of Patent: Jan. 16, 2024

(54) FLUID COOLING SYSTEM INCLUDING EMBEDDED CHANNELS AND COLD PLATES

(71) Applicant: The Research Foundation for the State University of New York, Albany, NY (US)

(72) Inventors: Leila Choobineh, Utica, NY (US); Bahgat Sammakia, Vestal, NY (US)

(73) Assignee: The Research Foundation for the State University of New York, Albany, NY (US)

(*) Notice: Subject to any disclaimer, the term of this patent is extended or adjusted under 35 U.S.C. 154(b) by 231 days.

(21) Appl. No.: 17/351,498

(22) Filed: Jun. 18, 2021

(65) Prior Publication Data
US 2021/0398878 A1    Dec. 23, 2021

Related U.S. Application Data

(60) Provisional application No. 63/040,932, filed on Jun. 18, 2020.

(51) Int. Cl.
*H01L 23/473* (2006.01)
*H05K 7/20* (2006.01)
(Continued)

(52) U.S. Cl.
CPC ........ *H01L 23/473* (2013.01); *F28D 15/0266* (2013.01); *F28D 15/0275* (2013.01);
(Continued)

(58) Field of Classification Search
CPC . H01L 23/473; H01L 23/427; H01L 23/4735; H05K 7/20254; H05K 7/20318;
(Continued)

(56) References Cited

U.S. PATENT DOCUMENTS 6,588,497 B1    7/2003 Glezer et al.
6,916,863 B2    7/2005 Hemmings et al.
(Continued)

FOREIGN PATENT DOCUMENTS

CN      106328615 A    1/2017
CN      105914189 B    3/2018
(Continued)

OTHER PUBLICATIONS

Chirag Kharangate, et al., Experimental Investigation of Embedded Micropin-Fins for Single-Phase Heat Transfer and Pressure Drop, Jun. 2018, Journal of Electronic Packaging, pp. 1-12, vol. 140.
(Continued)

*Primary Examiner* — Adam B Dravininkas
(74) *Attorney, Agent, or Firm* — Lance D. Reich; Peter Fallon; Autin Winter

(57) ABSTRACT

Fluid cooling systems are discussed herein. The system may include a top portion including a first surface receiving package(s) generating heat during operation, a second surface positioned opposite the first surface, and a plurality of embedded channels formed on the second surface. The system may also include a bottom portion positioned adjacent the top portion. The bottom portion may include inlet section(s) receiving a coolant and a plurality of inlet fluid conduits formed adjacent to and in fluid communication with the inlet section(s). The bottom portion may also include a plurality of outlet fluid conduits formed adjacent to the plurality of inlet fluid conduits. Each outlet fluid conduit may be in fluid communication with at least one of the inlet fluid conduits. The bottom portion may further include an outlet section(s) in fluid communication with the plurality of outlet fluid conduits and the inlet section(s).

20 Claims, 20 Drawing Sheets

(51) Int. Cl.
*H01L 23/427* (2006.01)
*F28F 3/04* (2006.01)
*F28D 15/02* (2006.01)

(52) U.S. Cl.
CPC .............. *F28F 3/04* (2013.01); *H01L 23/427* (2013.01); *H05K 7/20254* (2013.01); *H05K 7/20318* (2013.01)

(58) Field of Classification Search
CPC ............ H05K 7/20927; H05K 7/20772; F28D 15/0266; F28D 15/0275; F28D 15/00; F28F 3/04; F28F 2260/02; F28F 1/022; F28F 3/12
See application file for complete search history.

(56) References Cited

U.S. PATENT DOCUMENTS

| | | |
|---|---|---|
| 7,460,369 B1 | 12/2008 | Blish, II |
| 7,515,415 B2 | 4/2009 | Monfarad et al. |
| 7,523,780 B2 | 4/2009 | Dickey et al. |
| 8,110,746 B2 | 2/2012 | Lu et al. |
| 8,659,896 B2 | 2/2014 | Dede et al. |
| 9,939,170 B2 | 4/2018 | Beer et al. |
| 10,225,957 B2 | 3/2019 | Gao et al. |
| 10,225,958 B1 | 3/2019 | Gao |
| 2008/0135211 A1* | 6/2008 | Yassour ................ F28D 1/0475 165/80.4 |
| 2010/0014749 A1 | 1/2010 | Turlure |
| 2010/0157526 A1* | 6/2010 | Beaupre ................ H01L 23/473 361/689 |
| 2010/0302734 A1* | 12/2010 | Beaupre ............... H01L 23/3731 361/699 |
| 2019/0004573 A1 | 1/2019 | Kulkarni et al. |
| 2019/0006259 A1 | 1/2019 | Padmanabhan Ramalekshmi Thanu et al. |
| 2019/0300180 A1* | 10/2019 | Yang .................. H05K 7/20254 |
| 2020/0373223 A1* | 11/2020 | Chehade ................. F28F 3/08 |
| 2021/0239310 A1* | 8/2021 | Zhou ..................... H01L 23/467 |
| 2021/0366806 A1* | 11/2021 | Iyengar ................ H01L 23/433 |

FOREIGN PATENT DOCUMENTS

| | | |
|---|---|---|
| CN | 207611345 U | 7/2018 |
| CN | 108682658 A | 10/2018 |
| TW | 200636955 A | 10/2006 |

OTHER PUBLICATIONS

Chander Shekhar Sharma, et al., A novel method of energy efficient hotspot-targeted embedded liquid cooling for electronics: An experimental study, International Journal of Heat and Mass Transfer, vol. 88, Sep. 2015, pp. 684-694.

* cited by examiner

FLUID COOLING SYSTEM INCLUDING EMBEDDED CHANNELS AND COLD PLATES

CROSS-REFERENCE TO RELATED APPLICATIONS

This application claims priority to U.S. provisional application No. 63/040,932 filed on Jun. 18, 2020, the content of which is hereby incorporated by reference into the present application.

FIELD

The present disclosure relates to the field of fluid cooling, and specifically to the direct cooling of data centers, high-power electronic cooling, microelectronics packages, and chips using a fluid cooling system including embedded channels and cold plates.

BACKGROUND

High-power electronics, such as processors, microstructures or chips, and/or other electronic/semiconductor-based components improve operations of the systems that are included within. However during operation, these high-power electronics typically generate high heat during operation as well. In order to avoid degradation and/or fault within the electronics, the heat must be continuously removed and/or dissipated. Cooling method for handling high-power heat dissipation have been developed and implemented with these high-power electronics.

Air cooling, for example, is one traditional method of dissipating heat. Air cooling expands the surface area and/or increases the flow of air over the high-power electronic to be cooled. An example of the former is to add or form cooling fins to the surface of the electronic. Increasing the flow of air over the electronic may be achieved by providing a fan that blows air into or onto the electronic. The addition of fins to a heat sink increases its total surface area, resulting in greater cooling effectiveness. However, air cooling is limited with respect to its heat removal capacity and is not ideal for electronics and devices that require consistent, rapid cooling. That is, air cooling may only be capable of cooling at a gradual rate. Additionally, electronics that require consistent or constant cooling would need a fan (or other mechanical cooling device) to be operational at all times, which would strain the fan and/or would consume additional power within the system utilizing the fan and high-power electronic.

Improved cooling solutions in place of currently used methods are needed, in particular, the development of systems and/or methods with consistent heat removal capacity, to remove heat energy from microchips and high-power electronics, and allow these chips or electronics to cool and work efficiently over a longer period of time.

SUMMARY

The following is a summary in order to provide a basic understanding of some aspects of the disclosure. This summary is not intended to identify all key or critical elements of the disclosure or to delineate the entire scope of the disclosure. Its primary purpose is to present some concepts of the disclosure in a simplified form as a prelude to the more detailed description that is presented later.

Reference throughout this specification to "one embodiment" or "an embodiment" means that a specific feature, structure, or characteristic described in connection with an embodiment is included in at least one embodiment of claimed subject matter. Thus, appearances of phrases such as "in one embodiment" or "an embodiment" in various places throughout this specification are not necessarily all referring to the same embodiment. Furthermore, specific features, structures, or characteristics may be combined in one or more embodiments.

The present disclosure, discussed herein, addresses the deficiencies in cooling by introducing a system for cooling that includes embedded channels in a top portion and parallel inlet and outlet fluid conduits in a bottom portion. The inlet fluid conduits are connected to inlet sections which provides coolant to the inlet fluid conduits, and the outlet fluid conduits are connected to the outlet sections, which allow for high-temperature coolant to be constantly removed from the system through outlet conduits positioned adjacent the top portion, and move fresh water in to the system to continuously remove heat. The system allows for high-temperature, fluid coolant to be constantly removed from the system and fresh cool coolant to constantly move into the channels and conduits for constant and consistent removal of heat.

A first aspect of the disclosure provides a fluid cooling system, including: a top portion including: a first surface receiving at least one package generating heat during operation, a second surface positioned opposite the first surface, and a plurality of embedded channels formed on the second surface; and a bottom portion positioned adjacent the top portion, the bottom portion including: at least one inlet section receiving a coolant, a plurality of inlet fluid conduits formed adjacent to and in fluid communication with the at least one inlet section, a plurality of outlet fluid conduits formed adjacent to the plurality of inlet fluid conduits, each of the plurality of outlet fluid conduits in fluid communication with at least one of the plurality of inlet fluid conduits, and at least one outlet section in fluid communication with the plurality of outlet fluid conduits and the at least one inlet section.

A second aspect of the disclosure provides an assembly including: at least one package generating heat during operation; and a fluid cooling system connected to the package, the fluid cooling system cooling the at least one package during operation and including: a top portion positioned adjacent the package, the top portion including: a first surface contacting the package, a second surface positioned opposite the first surface, and a plurality of embedded channels formed on the second surface; and a bottom portion positioned adjacent the top portion, the bottom portion including: at least one inlet section receiving a coolant, a plurality of inlet fluid conduits formed adjacent to and in fluid communication with the at least one inlet section, a plurality of outlet fluid conduits formed adjacent to the plurality of inlet fluid conduits, each of the plurality of outlet fluid conduits in fluid communication with at least one of the plurality of inlet fluid conduits, and at least one outlet section in fluid communication with the plurality of outlet fluid conduits and the at least one inlet section.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As an initial matter, in order to clearly describe the current disclosure it will become necessary to select certain terminology when referring to and describing relevant components within the disclosure. When doing this, if possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms. What may be described herein as being a single part may include and be referenced in another context as consisting of multiple components. Alternatively, what may be described herein as including multiple components may be referred to elsewhere as a single part.

A fluid cooling system includes embedded channels and cold plates. Cold plates include parallel inlet channels and outlet channels. The fluid cooling system discussed herein may be used in, but not limited to, high-power electronic cooling, direct fluid cooling of data centers, microelectronics package cooling, and chip cooling.

These and other embodiments are discussed below with reference to FIGS. 1-15. However, those skilled in the art will readily appreciate that the detailed description given herein with respect to these Figures is for explanatory purposes only and should not be construed as limiting.

Figure 1:
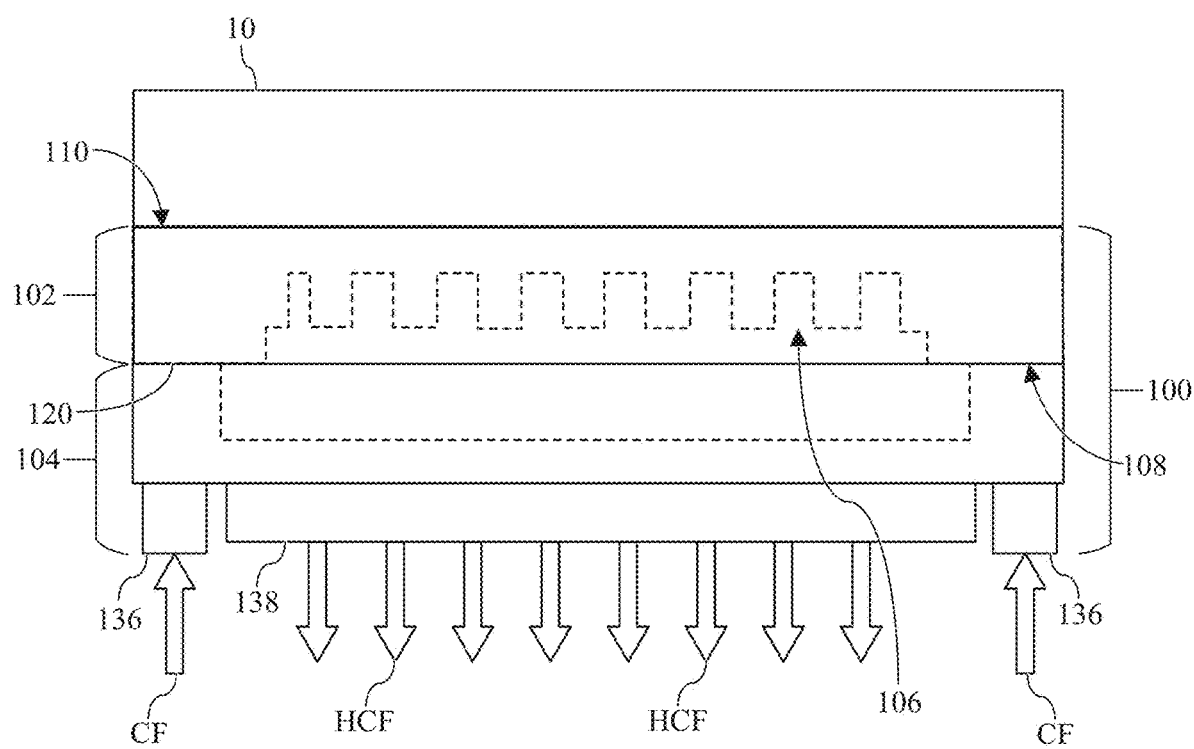
FIG. 1 depicts a schematic front view of a package and an embodiment of the fluid cooling system, according to embodiments of the disclosure.

As depicted in FIG. 1, the cooling system 100 comprises two portions: a top portion 102 connected to at least one component, heat-generating electronic, and/or package 10 (hereafter, "package 10"); and a bottom portion 104 positioned adjacent top portion 102. In a non-limiting example, and as shown in FIG. 1, top portion 102 and bottom portion 104 may be formed as two distinct portions and/or components, and may be coupled and/or affixed to one another to form fluid cooling system 100. In another non-limiting example, top portion 102 and bottom portion 104 may be formed as a single, integral, and/or continuous body or component. Top portion 102 and bottom portion 104 of fluid cooling system 100 may be formed using any suitable manufacturing technique, method, and/or process including, but not limited to, additive manufacturing (e.g., 3D printing), machining, casting, and the like. In the instance where top portion 102 and/or bottom portion 104 are formed using additive manufacturing, the density and/or porosity of the portion and/or features included in the portion may vary. Additionally, top portion 102 and/or bottom portion 104 may be formed from any suitable thermally conductive material including, but not limited to, copper, aluminum, metal, metal alloys, ceramics, and other material having similar structural, material, and thermal characteristics. In the non-limiting example where top portion 102 and bottom portion 104 are formed as distinct and/or two separate components, top portion 102 and/or bottom portion 104 may be coupled and/or affixed to one another using any suitable coupling technique, feature, and/or process. For example, top portion 102 of fluid cooling system 100 may be coupled to bottom portion 104 by bonding, mechanically fastening, welding/brazing, adhering, and the like. Additionally in the non-limiting, top portion 102 and bottom portion 104 may be formed from the same material, or alternatively may be formed from distinct material having distinct similar structural, material, and thermal characteristics. Still further in another non-limiting example, top portion 102 may be formed integral with package 10. That is, top portion 102, and more specifically embedded channels 106 discussed herein, may be formed (e.g., etched, grown, etc.) directly on a bottom or contact surface/layer of package 10. For example, where package 10 includes a base or bottom silicon layer, top portion 102 and the features discussed herein (e.g., embedded channels 106) may be formed directly in and/or formed integral in the silicon layer of package 10.

Figure 2A:
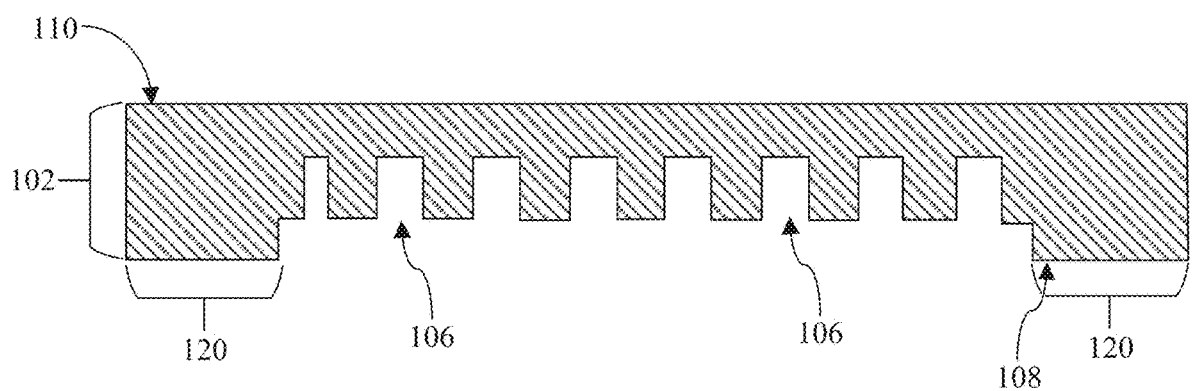
FIG. 2A depicts a schematic, cross-sectional front view of embedded channels formed in a top portion of the fluid cooling system shown in FIG. 1, according to embodiments of the disclosure.
Figure 2B:
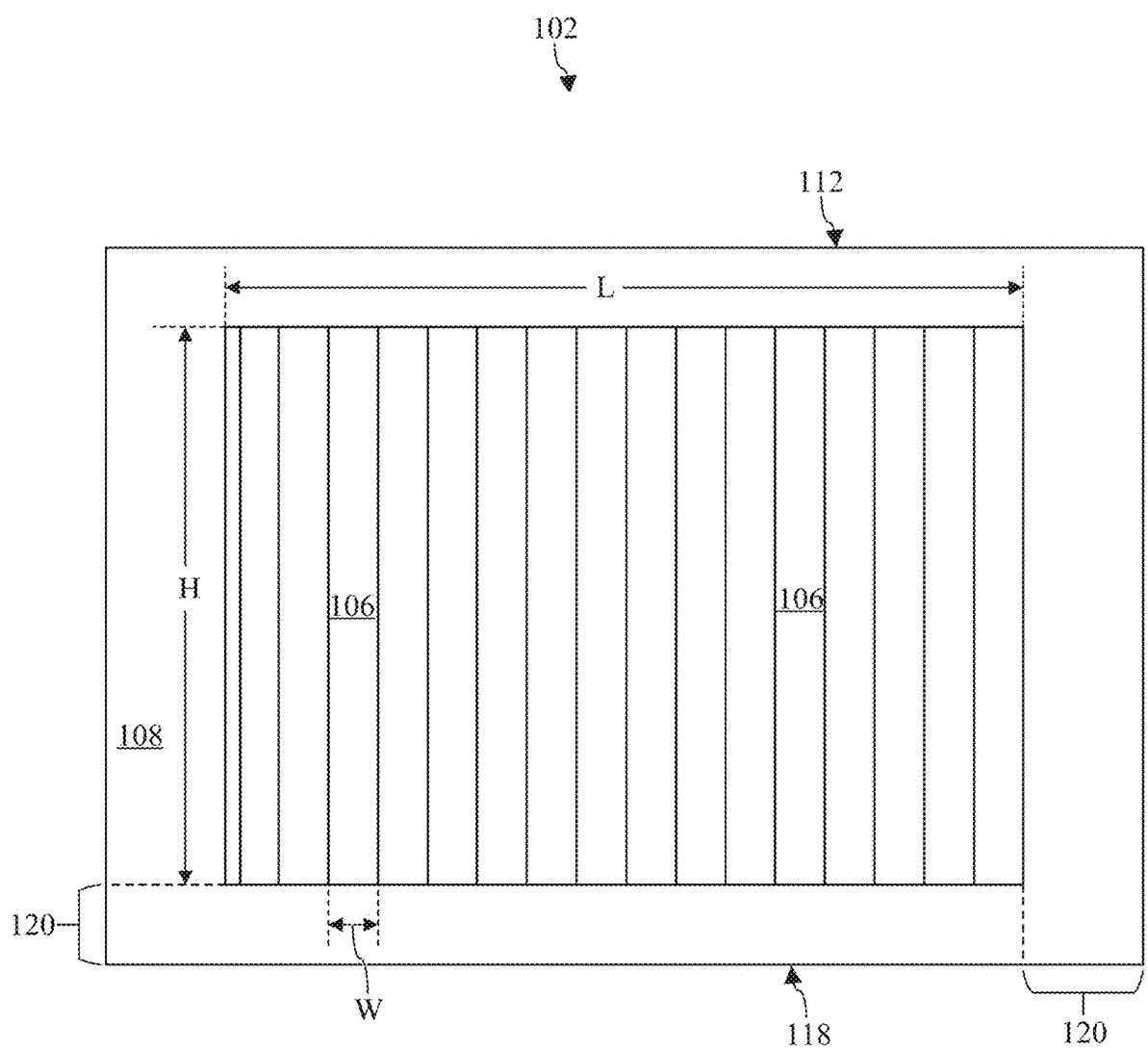
FIG. 2B depicts a schematic bottom view of an embodiment of the embedded channels shown in FIG. 2A, according to embodiments of the disclosure.

As depicted in FIG. 1, embedded channels 106 (shown in phantom) are located or formed in top portion 102. Specifically, embedded channels 106 may be formed within top portion 102 and/or extend through a bottom surface 108 of top portion 102 that may be positioned opposite a top surface 110 that may contact and/or be positioned adjacent a package 10 or any other suitable component or source that may generate heat and require cooling during operation. Embedded channels 106 may span and/or extend substantially between two opposite sides or ends 112, 118 (see, FIG. 2B) of top portion 102 for fluid cooling system 100. As shown in FIGS. 1, 2A, and 2B embedded channels 106 may span and/or extend adjacent to sides or ends 112, 118, but may not, for example, extend through sides or ends 112, 118. As such, boarder or lip 120 of top portion 102 may substantially surround and/or encompass embedded channels 106 formed therein. As discussed herein, top portion 102 including embedded channels 106 may be formed from any suitable thermally conductive material (e.g., metal, metal alloys, and the like). Forming top portion 102 having embedded channels 106 from a thermally conductive material may increase the amount of heat transfer between a cooling fluid and package 10, and/or may increase the heat dissipation for package 10, as discussed herein.

Figure 11:
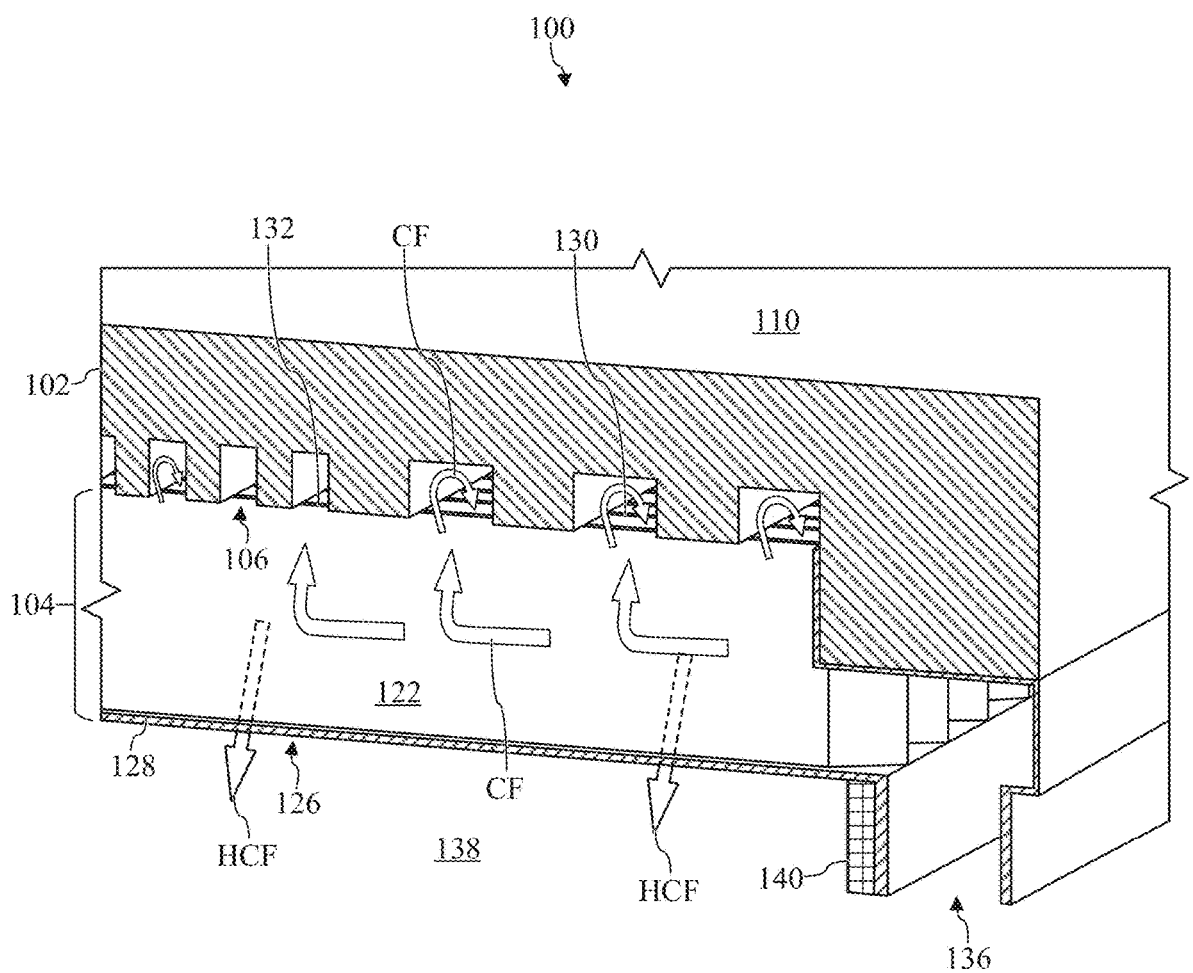
FIG. 11 depicts a cross-sectional view of the embedded channels, the inlet channels, outlet channels, and ends of the inlet section that provides inlet fluids into the inlet channels of the fluid cooling system, according to embodiments of the disclosure.
Figure 12:
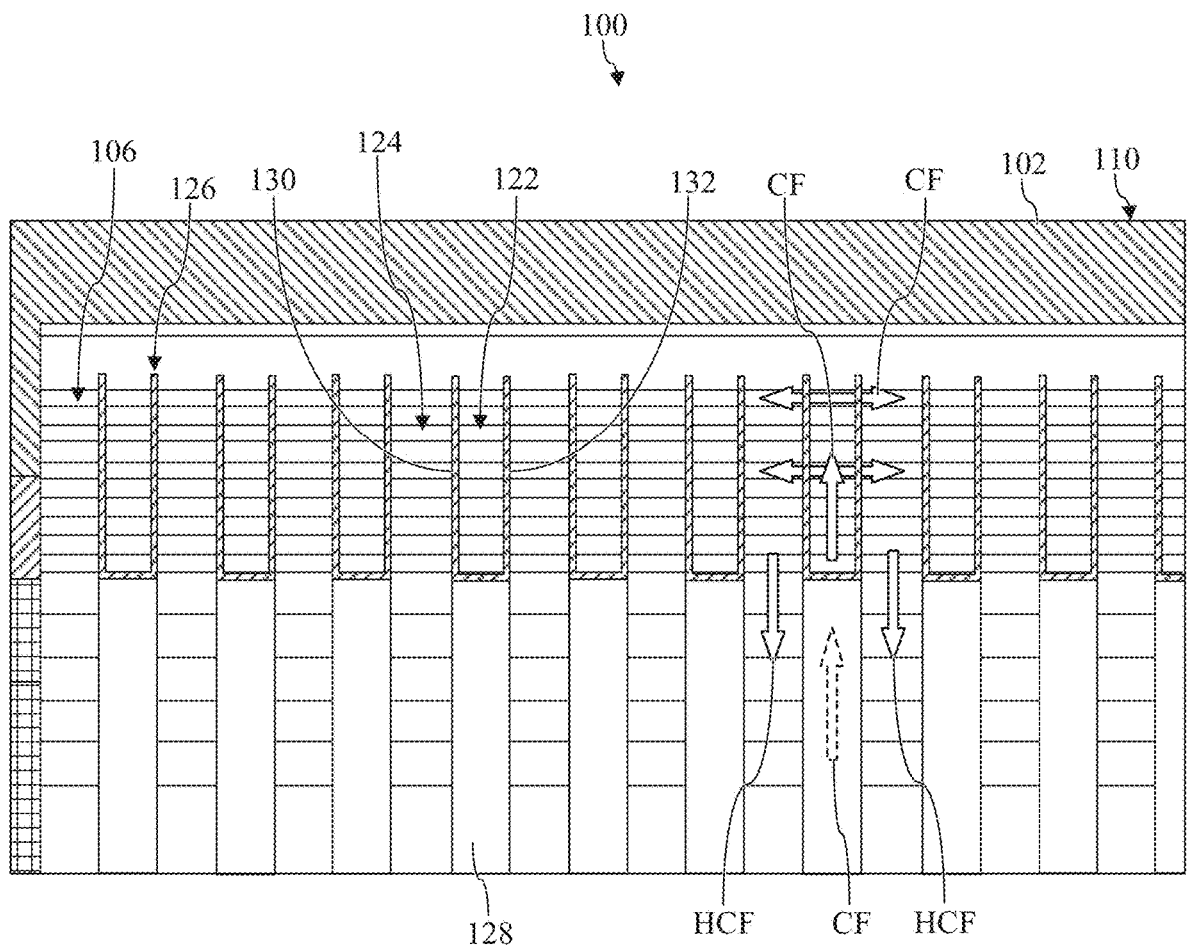
FIG. 12 depicts a bottom, cross-sectional view of the top portion and a portion of the bottom portion of the fluid cooling system, according to embodiments of the disclosure.

In non-limiting examples, the size, geometry, and/or dimensions of embedded channels 106 formed in top portion 102 may be uniform, or alternatively, may vary and/or be distinct from other embedded channels 106 formed within the same top portion 102. The dimensions of the embedded channels 106 may vary based on package 10 size, application, and/or the amount of power generated. In other non-limiting examples, and as discussed herein, the dimensions of embedded channels 106 may vary based on heat-generation characteristics and/or high heat areas of package 10 positioned on fluid cooling system 100. The channel's width and/or heights can be adjusted for different amounts of heat removal. For example, in uniform heat generation or heat flux, the embedded channels 106 are uniform with the same dimension (see e.g., FIG. 8C). Conversely for non-uniform heat generation or heat flux (e.g., distinct heat areas formed in package 10), the density of channels 106 in a higher heat flux region (e.g., centralized portion of top portion 102) is increased, whereas the width is decreased. This non-limiting configuration allows for higher heat flux regions to remove heat from these regions and provide more uniform temperature for package 10. In a non-limiting example, the amount of power generation may vary between approximately 300 W/cm$^2$ to approximately 1 kW/cm$^2$. As shown in the non-limiting example of FIG. 2B, embedded channels 106 formed in top portion 102 may extend over a length (L) of top portion 102 by approximately 80 millimeters (mm), each channel 106 may include a width (w) of approximately 0.5 mm, and may include a height (H) of 50 mm. In other embodiments, the dimensions may vary based on package 10 size, the heat source/heated-areas, the type of package, and/or the desired implementation of cooling fluid system 100/package 10. Briefly turning to FIG. 11, another non-limiting example is shown where top portion 102 includes embedded channels 106 having a variation or distinction in dimensions when compared to one another. For example, and as shown in FIG. 11, the individual embedded channels 106 within the fluid cooling system 100 vary in size. The width of the embedded channels 106 closest to inlet sections formed in bottom portion 104 of fluid cooling system 100, is greater than the embedded channels 106 formed farther away from the inlet section. This non-limiting configuration may be a result of package 10 (see, FIG. 1) positioned on top portion 102 includes a higher cooling demand in a central portion and/or package 10 may generate more heat in the central portion (e.g., portion of package 10 positioned proximate/inward from the inlet section), as discussed herein.

Bottom portion 104 of fluid cooling system 100 may include a plurality of parallel inlet fluid conduits 122 and outlet fluid conduits 124. As discussed herein, bottom portion 104, and components discussed herein forming the plurality of inlet fluid conduits 122/outlet fluid conduits 124, may be formed from the same or distinct material as top portion 102. In one non-limiting example, bottom portion 104 may be formed from thermally conductive material. In other non-limiting examples, bottom portion 104 may be formed from distinct material such as, but not limited to, silicone, ceramic, polymers, or any other suitable material that may aid in the operation of fluid cooling system 100 and/or the cooling of package 10, as discussed herein.

Figure 3A:
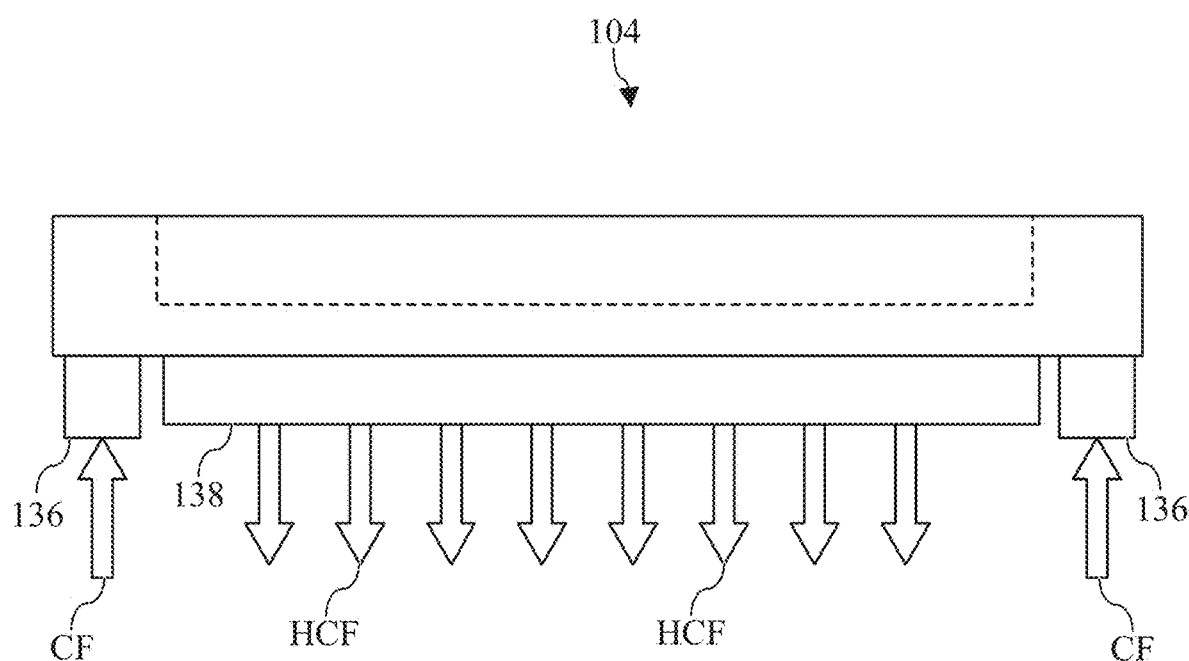
FIG. 3A depicts a schematic front view of a portion of inlet sections and outlet sections within a bottom portion of the fluid cooling system shown in FIG. 1, according to embodiments of the disclosure.
Figure 3B:
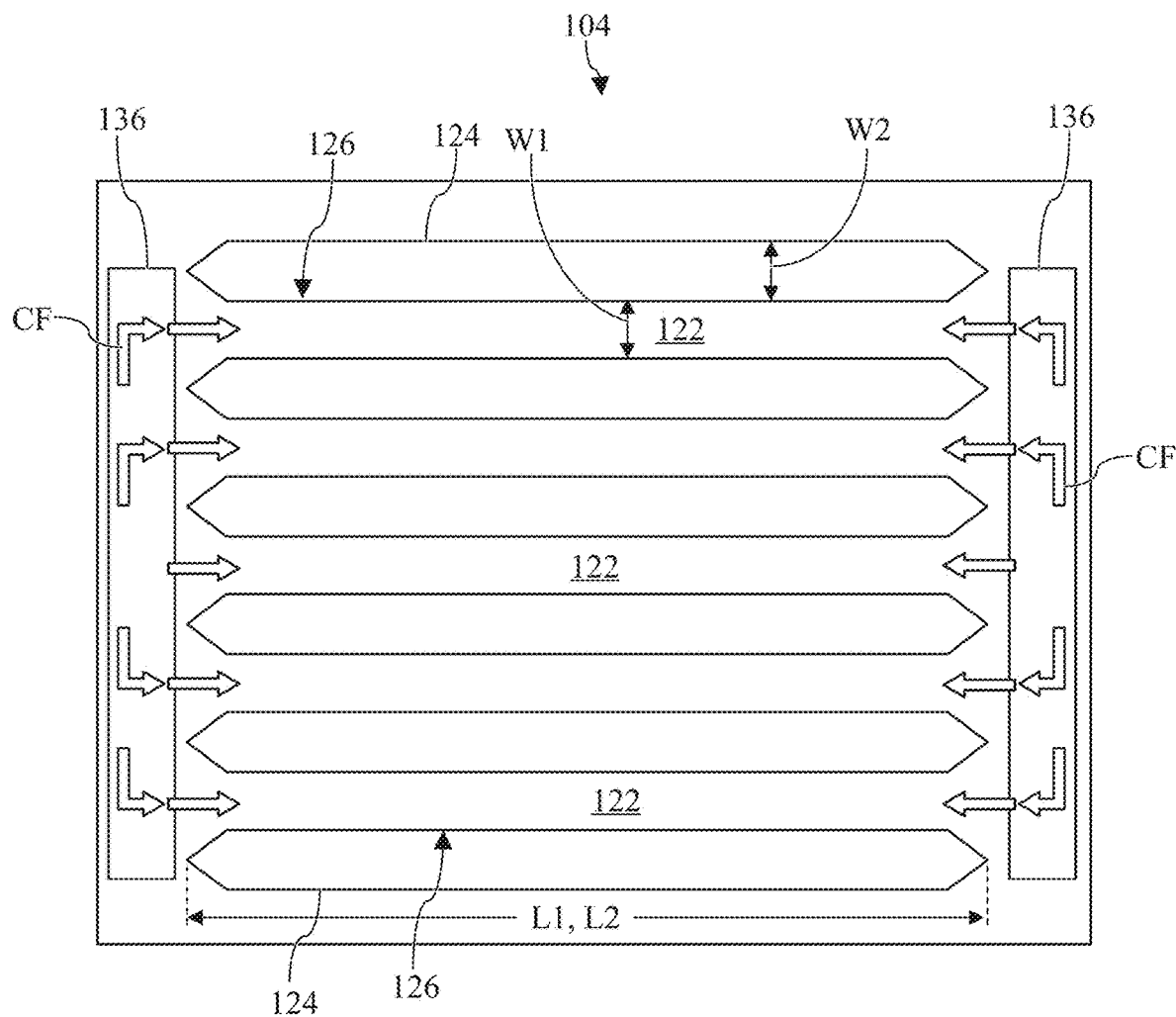
FIG. 3B depicts a schematic top view of the inlet channels connected to the inlet sections, outlet channels connected to the outlet sections, and the direction of flow of fluid/coolant through the inlet sections to the inlet channels, and out of the outlet channels within the bottom portion of the fluid cooling system, according to embodiments of the disclosure.
Figure 4:
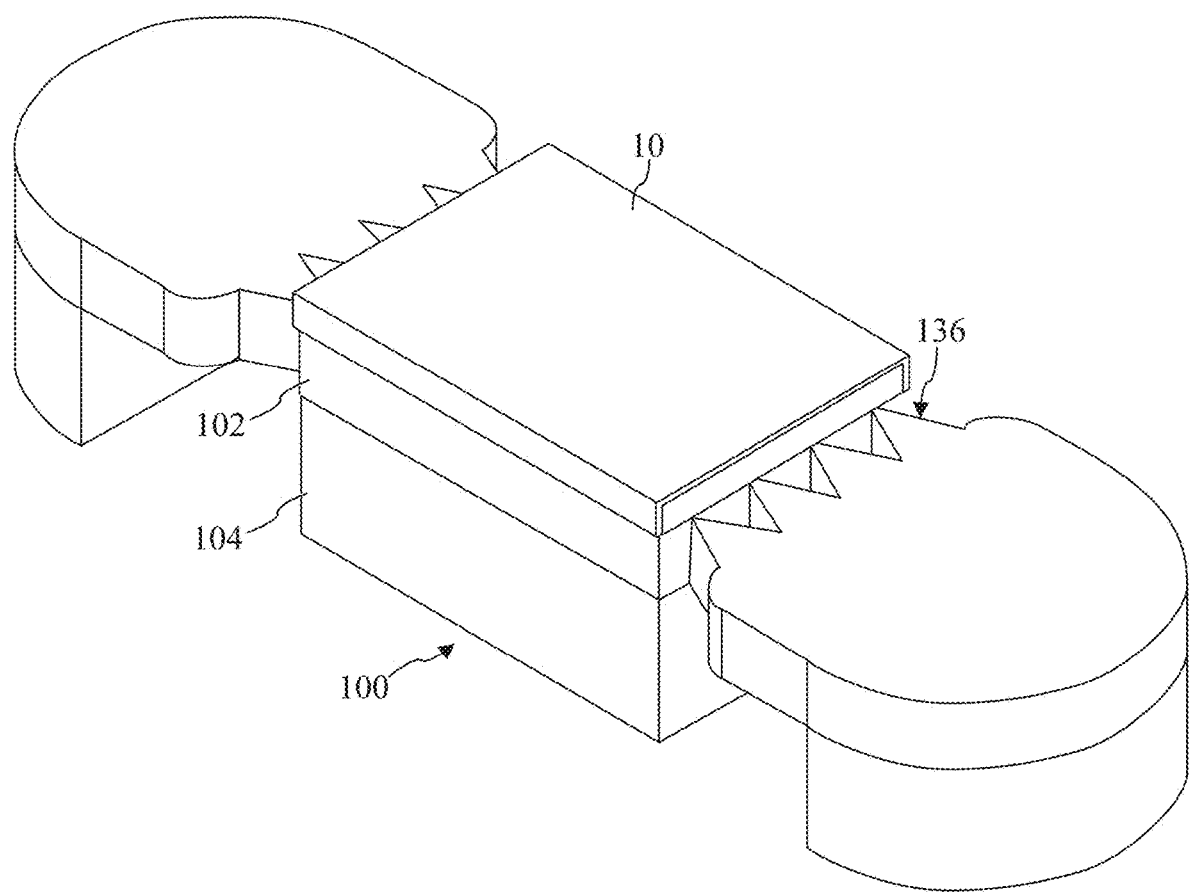
FIG. 4 depicts an isometric view of the fluid cooling system connected with the tapered triangles that depict the inlet channels, according to embodiments of the disclosure.
Figure 5:
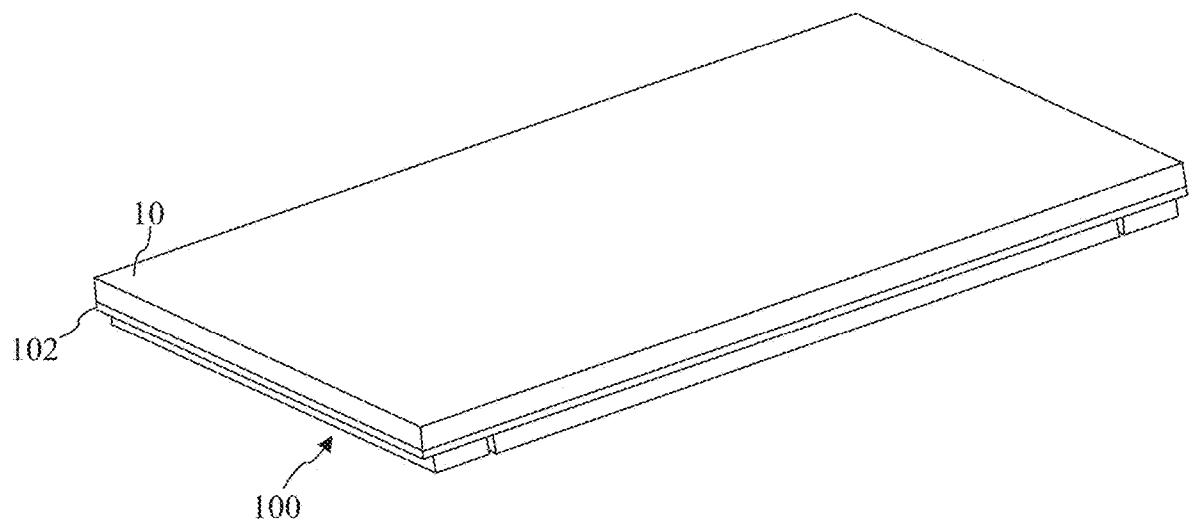
FIG. 5 depicts an isometric top view of a top portion of a fluid cooling system, according to embodiments of the disclosure.
Figure 6:
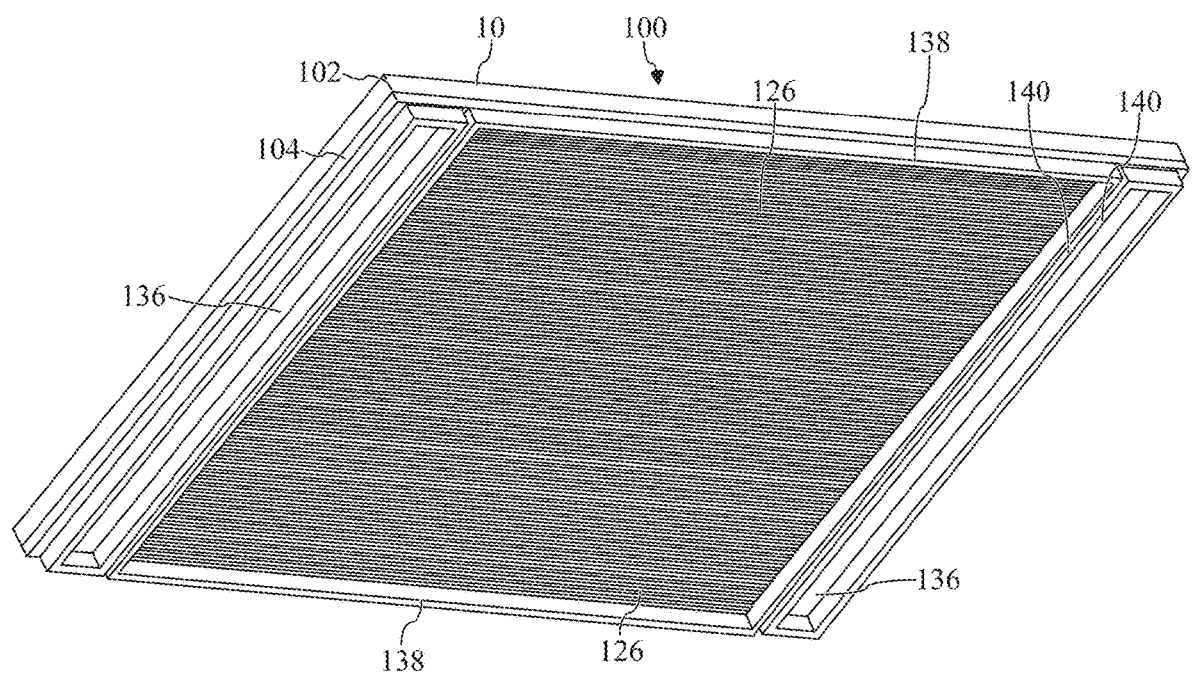
FIG. 6 depicts an isometric bottom view of a top portion and bottom portion of a fluid cooling system, according to embodiments of the disclosure.
Figure 8A:
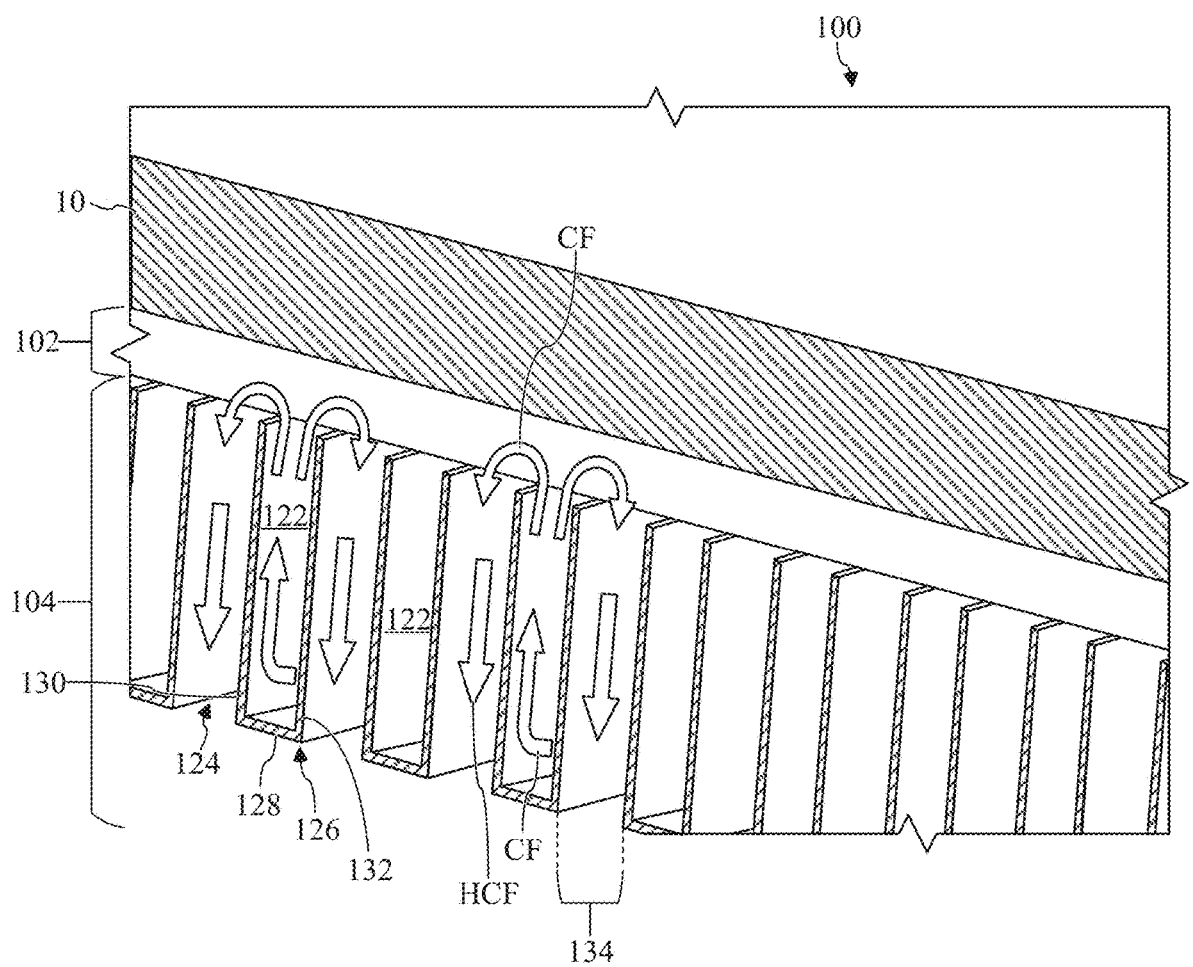
FIG. 8A depicts a cross-sectional view of the fluid cooling system, according to embodiments of the disclosure.
Figure 8B:
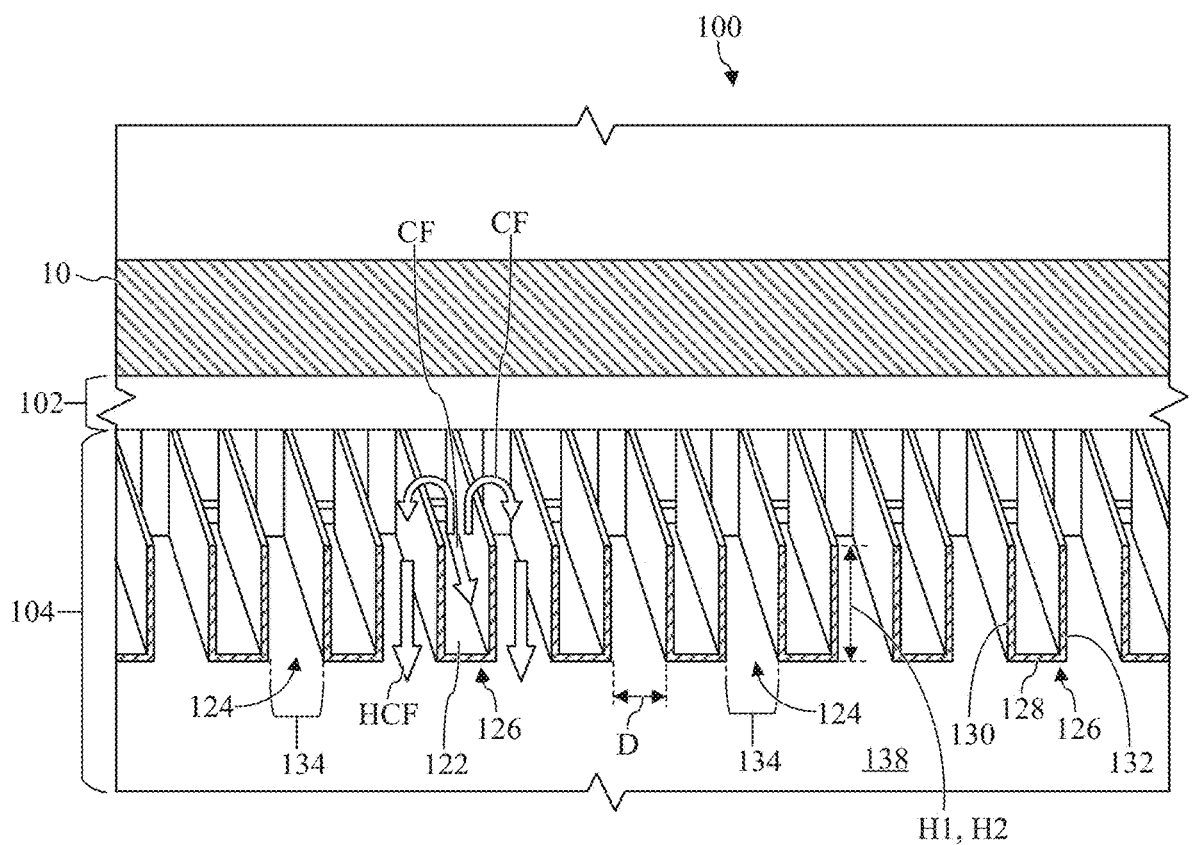
FIG. 8B depicts another cross-sectional view of the fluid cooling system, according to embodiments of the disclosure.
Figure 8C:
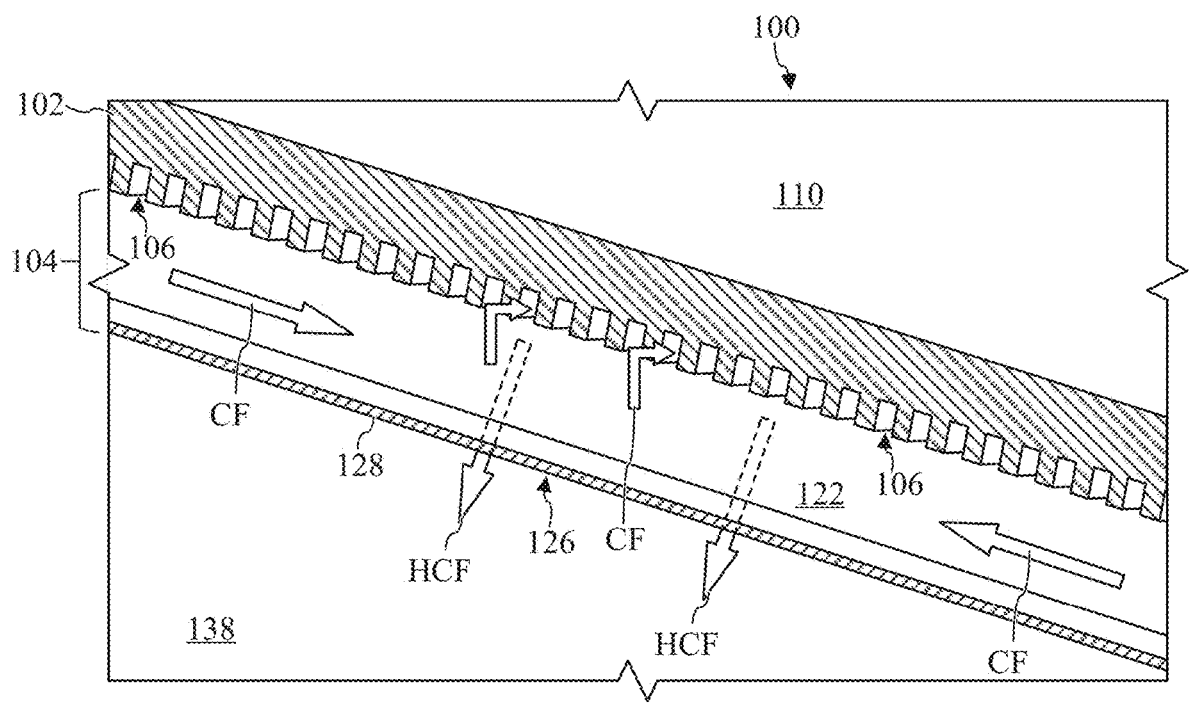
FIG. 8C depicts an additional cross-sectional view of the fluid cooling system, according to embodiments of the disclosure.
Figure 9:
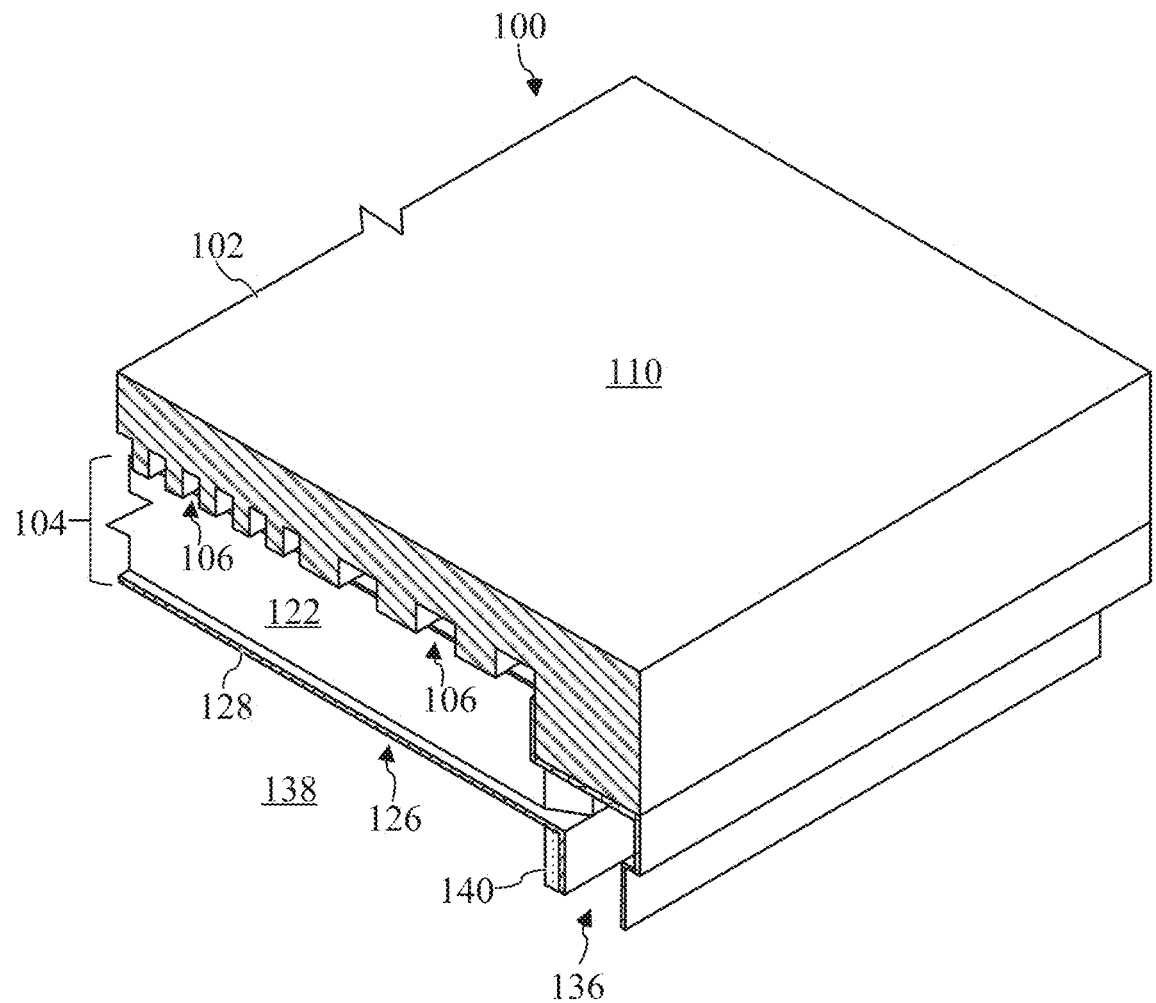
FIG. 9 depicts an isometric cross-sectional view of a portion of a fluid cooling system including a top portion with embedded channels and a bottom portion, according to embodiments of the disclosure.

In a non-limiting example shown in FIGS. 3B and 8A, the plurality of inlet fluid conduits 122 and outlet fluid conduits 124 may be at least partially defined and/or formed by cold plates 126 extending through and/or formed within bottom portion 104 of fluid cooling system 100. In the non-limiting example, each of the plurality of cold plates 126 may be formed within bottom portion 104 to include a base 128 and two opposing sidewalls 130, 132 extending substantially perpendicular to base 128. As such, each cold plate 126 may form a substantially "U" shaped configuration and/or feature. However, it is understood that the shape or configuration of cold plates 126 may be any suitable shape or geometry to form and/or define inlet fluid conduits 122 and outlet fluid conduits 124 as discussed herein. Additionally, each of the plurality of cold plates 126 may also be separated from one another at a predetermined distance (D) (see, FIG. 8B). In non-limiting examples shown in FIGS. 10A-12, cold plate may contact and/or abut embedded channels 106 formed in top portion 102 of fluid cooling system 100. For example, opposing sidewalls 130, 132 of cold plate may contact, abut, and/or touch a (bottom) portion/surface of the embedded channels 106 formed in top portion 102. In other non-limiting examples, cold plate 126, and more specifically opposing sidewalls 130, 132 of each cold plate 126, may be positioned adjacent to, but spaced apart or separated from, embedded channels 106 formed in top portion 102 of fluid cooling system 100.

Based on the configuration of the plurality of cold plates 126 within bottom portion 104 of fluid cooling system 100, inlet fluid conduits 122 and outlet fluid conduits 124 may be formed therein. For example, each of the plurality of inlet fluid conduits 122 of bottom portion 104 may be formed within and/or may be defined by the cold plates 126. More specifically, the space and/or area 134 formed between base 128 and opposing sidewalls 130, 132 of each cold plate may substantially form and/or define inlet fluid conduit 122 of bottom portion 104. Furthermore, and as a result of spacing each cold plate a predetermined distance apart, each of the plurality of outlet fluid conduits 124 may be defined by the space or area 134 between adjacent (and distinct) cold plates 126. That is, each outlet fluid conduit 124 may be formed between two distinct cold plates 126 and/or may be defined by a sidewall 132 of a first cold plate, and a distinct sidewall 130 of a second/distinct cold plate positioned adjacent the first cold plate. Furthermore, and as shown in the non-limiting example of FIG. 3B, inlet fluid conduits 122 and outlet fluid conduits 124 may alternate within bottom portion 104 of fluid cooling system 100. Comparing FIGS. 2B and 3B, and with further support shown in FIGS. 10A-12, the plurality of inlet fluid conduits 122 and the plurality of outlet fluid conduits 124 may be formed, positioned, and/or oriented within fluid cooling system 100 substantially perpendicular to embedded channels 106 formed in top portion 102. During operation, the top portion 102 generally has a higher temperature, and the perpendicular design allows for an increase in the direct contact of flow or cooling fluid with the top portion 102. The plurality of the inlet fluid conduits 122 and outlet fluid conduits 124 may be in fluid communication and/or fluidly coupled to one another. For example, and as discussed herein in detail, two adjacent inlet fluid conduits 122 may be in fluid communication and fluidly coupled with a single outlet fluid conduit 124, and may provide and/or flow coolant or cooling fluid (e.g., water, water with additives, fluorocarbon) from each of the inlet fluid conduits 122 to the (single) outlet fluid conduit 124 when cooling package(s) 10 positioned above and/or contacting the top portion 102 of fluid cooling system 100.

In a non-limiting example, the size, spacing, geometry, and/or dimensions of cold plates 126, inlet fluid conduits 122, and/or outlet fluid conduits 124 may be substantially uniform within bottom portion 104. In a non-limiting example, and as shown in FIG. 3B, both inlet fluid conduits 122 and outlet fluid conduits 124 may have a width (W1, W2) of 0.5 mm, a length (L1, L2) of approximately 80 mm, and a height (e.g., sidewalls 130, 132 for cold plates 126) (H1, H2) (see, FIG. 8B) of approximately 4.0 mm. Additionally, in the non-limiting example, the outermost cold plates 126 included in bottom portion 104 of fluid cooling system 100 may be spaced from an edge or side of bottom portion 104 by a distance of approximately 0.75 mm. Additional non-limiting embodiments may include cold plates 126, inlet fluid conduits 122, and/or outlet fluid conduits 124 that have and/or or formed with varying size, spacing, geometry, and/or dimensions. The dimensions of the inlet fluid conduits 122 and the outlet fluid conduits 124 may vary based on package(s) 10 size, application, and the amount of power generated, and more specifically, the width and/or height of the conduits can be adjusted for different amounts of heat removal. The dimensions for the conduits may vary based on application of the fluid cooling system 100 and/or fabrication methods for forming fluid cooling system 100.

Although shown as being substantially uniform in shape, size, dimension, and/or spacing, it is understood that cold plates 126 of bottom portion 104 may include varied shape, size, dimensions, and/or spacing therein. For example, the dimension (e.g., width) of outer groups of the plurality of cold plates 126 positioned adjacent opposing sides of bottom portion 104 may be wider than a central group of cold plates 126 centrally located and/or positioned between the outer groups of cold plates. Additionally, or alternatively, the spacing between outer groups of the plurality of cold plates 126 positioned adjacent opposing sides of bottom portion 104 may be larger than the spacing between a central group of cold plates 126 centrally located and/or positioned between the outer groups of cold plates. Furthermore, the non-limiting examples shown and discussed herein describe inlet fluid conduits 122, outlet fluid conduits 124, and/or cold plates 126 as being substantially linear and/or parallel. However, inlet fluid conduits 122/outlet fluid conduits 124 may also include non-linear and/or distinct configurations as a result of the geometry and/or configuration of cold plates 126. For example, cold plates 126 may be formed within bottom portion 104 to include bends, curves, junctions, and/or other non-linear geometries. Additionally, the geometry of cold plates 126 may vary within bottom portion 104 (e.g., varying degrees of curvature between each cold plate). As discussed herein, bottom portion 104 including cold plates 126, which may have these unique, non-linear geometries, may be formed using additive manufacturing techniques and/or systems.

Bottom portion 104 may also include at least one inlet section 136 formed therein. In the non-limiting examples shown in FIGS. 1, 3A, 3B, and 7, bottom portion 104 of fluid cooling system 100 may include two inlet sections 136 (e.g., shown in blue in FIG. 3A) formed on opposite sides or ends of the plurality of cold plates 126, inlet fluid conduits 122, and outlet fluid conduits 124. As such, each of the plurality of cold plates 126, inlet fluid conduits 122, and outlet fluid conduits 124 may extend between the two distinct inlet sections 136. As shown in FIG. 3B, each inlet section 136 may be in fluid communication and/or fluidly coupled to each of the plurality of inlet fluid conduits 122. In a non-limiting example, each inlet section 136 may include a width of approximately 10 mm and a length of approximately 70 mm. However, it is understood that the size or dimensions of inlet section 136 may be dependent upon the size and/or dimensions of the plurality of cold plates 126, the inlet fluid conduits 122, and/or the outlet fluid conduits 124. As discussed herein, inlet section 136 may provide and/or supply a cooling fluid or coolant to each of the plurality of inlet fluid conduits 122 formed or defined by cold plates 126 to aid in the cooling of package(s) 10 positioned above and/or contacting the top portion 102 of fluid cooling system 100.

Additionally, bottom portion 104 of fluid cooling system 100 may also include at least one outlet section 138. Outlet section 138 may be formed and/or positioned adjacent and/or below the plurality of cold plates 126 of bottom portion 104. Outlet section 138 may also be in fluid communication and/or fluidly coupled to outlet fluid conduits 124 formed and/or defined with bottom portion 104 of fluid cooling system 100. As discussed herein, outlet section 138 may receive and/or collect the (heated) cooling fluid that may flow from inlet fluid conduit 122 to outlet fluid conduit 124 during the cooling process.

Figure 7:
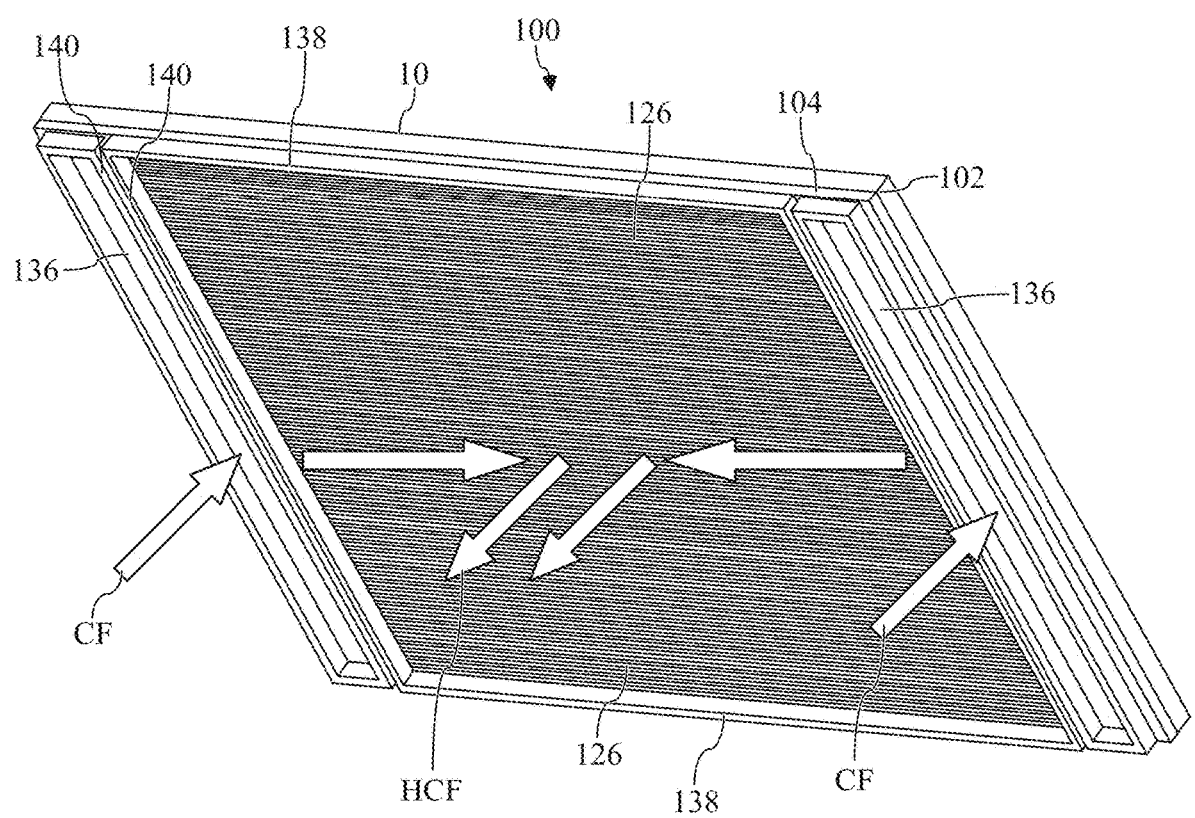
FIG. 7 depicts an isometric bottom view of the top portion and bottom portion of FIG. 6 and the direction of flow of fluid within the portions, according to embodiments of the disclosure.

Turning to FIG. 7, for example, bottom portion 104 may also include at least one structure or barrier 140 (e.g., wall) that may separate inlet section 136 and outlet section 138 within bottom portion 104 of fluid cooling system 100. In the non-limiting example, two walls extending between each inlet section 136 and outlet section 138 may separate the two sections within bottom portion 104. As a result of separating inlet sections 136 and outlet section 138, coolant provided or supplied to inlet sections 136 may be separated from and/or may not mix with (heated) coolant received by or supplied to outlet section 138 of bottom portion 104 during the cooling process discussed herein.

Although not shown in the figures, it is understood that outlet section 138 and inlet sections 136 may be in fluid communication with one another and/or may form a closed loop or fluidic circuit. That is, and as discussed herein, heated coolant or cooling fluid received by or supplied to outlet section 138 may flow to an distinction portion of fluid cooling system 100, where the temperature of the coolant or cooling fluid may be reduced. Once the temperature of the coolant or cooling fluid is reduced, the coolant or cooling fluid may be provided (back) inlet section(s) 136 to be recirculated through the plurality of inlet fluid conduits 122 before once again absorbing heat and being supplied to the respective outlet fluid conduits 124. In other non-limiting examples discussed herein (see, FIG. 15), additional components may be positioned between and/or in fluid communication with outlet section 138 and inlet sections 136 of fluid cooling system 100. These additional components may aid in the cooling of the fluid within system 100 and/or for removing and/or filtering the fluid used within fluid cooling system 100.

As depicted in FIG. 1, in the disclosed system 100, coolant or cooling fluid (CF) may be received by inlet sections 136 which are located on both sides of the bottom portion 104 to go through inlet fluid conduits 122. The fluid then moves upwards, along the opposing sidewalls of cold plate 126, toward embedded channels 106 formed in the top portion 102. Once the fluid reaches the top of sidewalls 130, 132 of cold plate 126, the coolant or cooling fluid may contact or flow over embedded channels 106 to absorb heat transferred to embedded channels 106 by package(s) 10 or source of heat generation. Absorbing the heat may increase the temperature of the coolant or cooling fluid, which may be provided/supplied to, and/or subsequently flow to and downward through the respective outlet fluid conduits 124 formed in bottom portion 104 of fluid cooling system 100. Outlet fluid conduits 124 move the warmed coolant or heated cooling fluid (HCF) out of the system via outlet section 138, as inlet sections 136 continuously move or supply fresh coolant or cooling fluid in to remove heat from package(s) 10. As discussed herein, since only the outlet fluid conduits are attached to the outlet section 138, the inlet and outlet fluid do not mix with each other. This allows for constant fresh coolant or cooling fluid in the inlet fluid conduits 122.

Figure 10A:
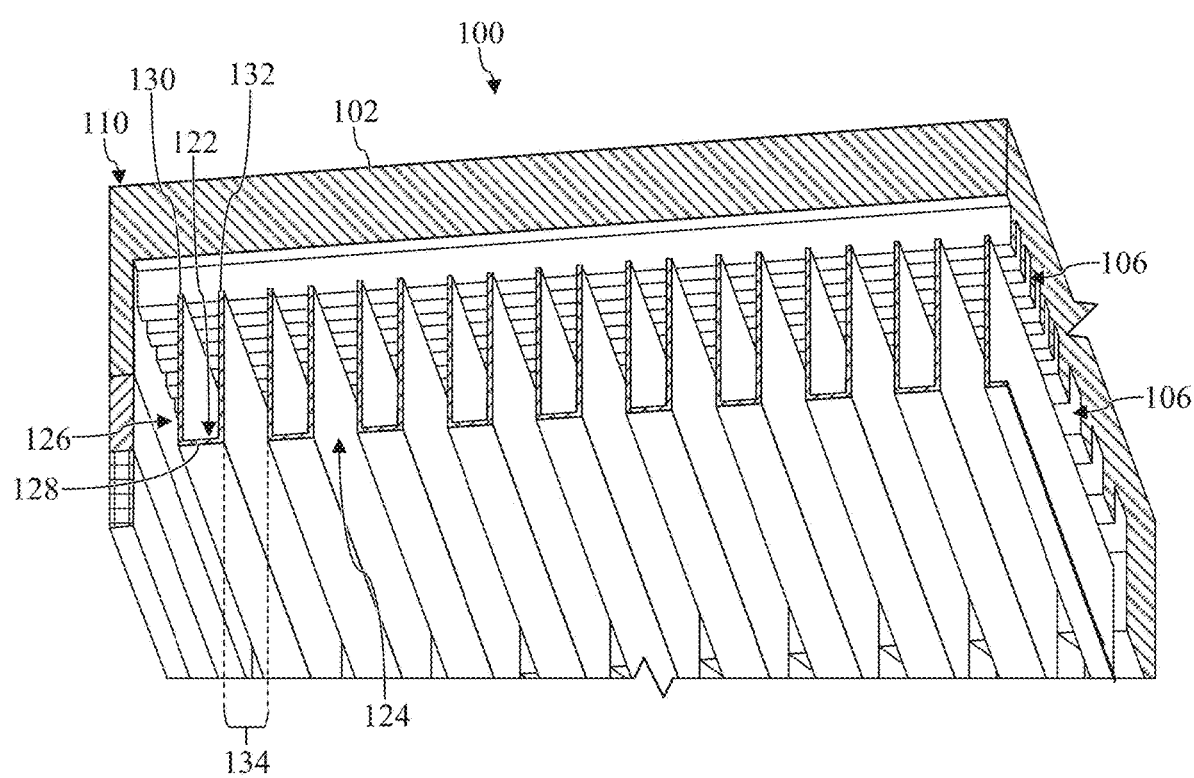
FIG. 10A depicts a cross-sectional view of inlet channels and outlet channels included in the fluid cooling system shown in FIG. 9, according to embodiments of the disclosure.
Figure 10B:
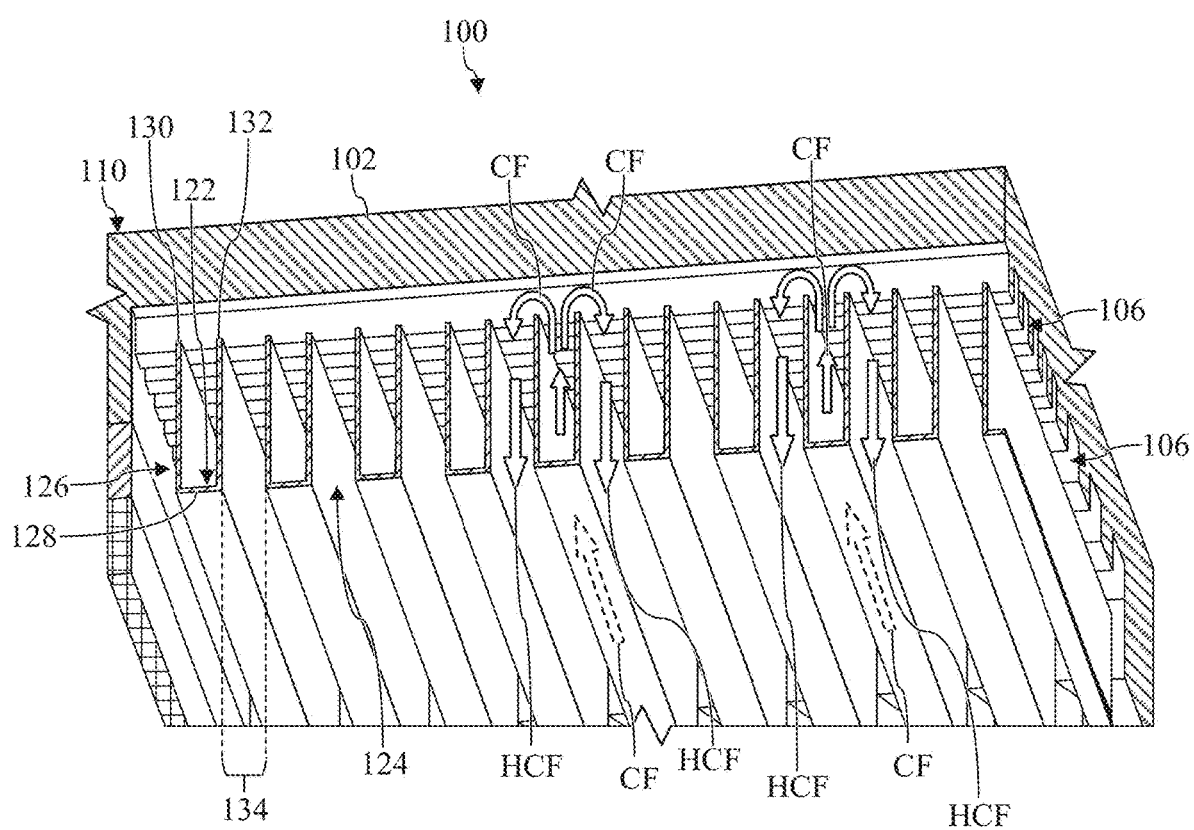
FIG. 10B depicts a cross-sectional view of the inlet channels, outlet channels, and direction of flow for the coolant, according to embodiments of the disclosure.

As depicted in FIG. 10B, a front view of the inlet fluid conduits 122 and outlet fluid conduits 124 show the direction of the flow of cooling fluid throughout the system. The cooling fluid (CF) enters through the inlet fluid conduits 122 shown by arrows, flows upwards towards embedded channels 106, and then spills over opposing sidewalls 130, 132 of cold plate 126, out of outlet fluid conduits 124, and downwards into outlet section 138. Additionally, the arrows of representing heated cooling fluid (HCF) indicate coolant or cooling fluid that has an increased temperature as a result of absorbing heat from embedded channels 106 formed in top portion 102 of fluid cooling system 100.

As depicted in FIG. 11, a front view of the embedded channels 106 shows the direction of flow of cooling fluid as it enters through the tapered end of the inlet section 136, up towards the embedded channels 106, and flows out of the top of the inlet fluid conduit 122 and downwards into the outlet fluid conduits 124. This allows constant cooling in the by circulating constant coolant or cooling fluid in the system.

Figure 13:
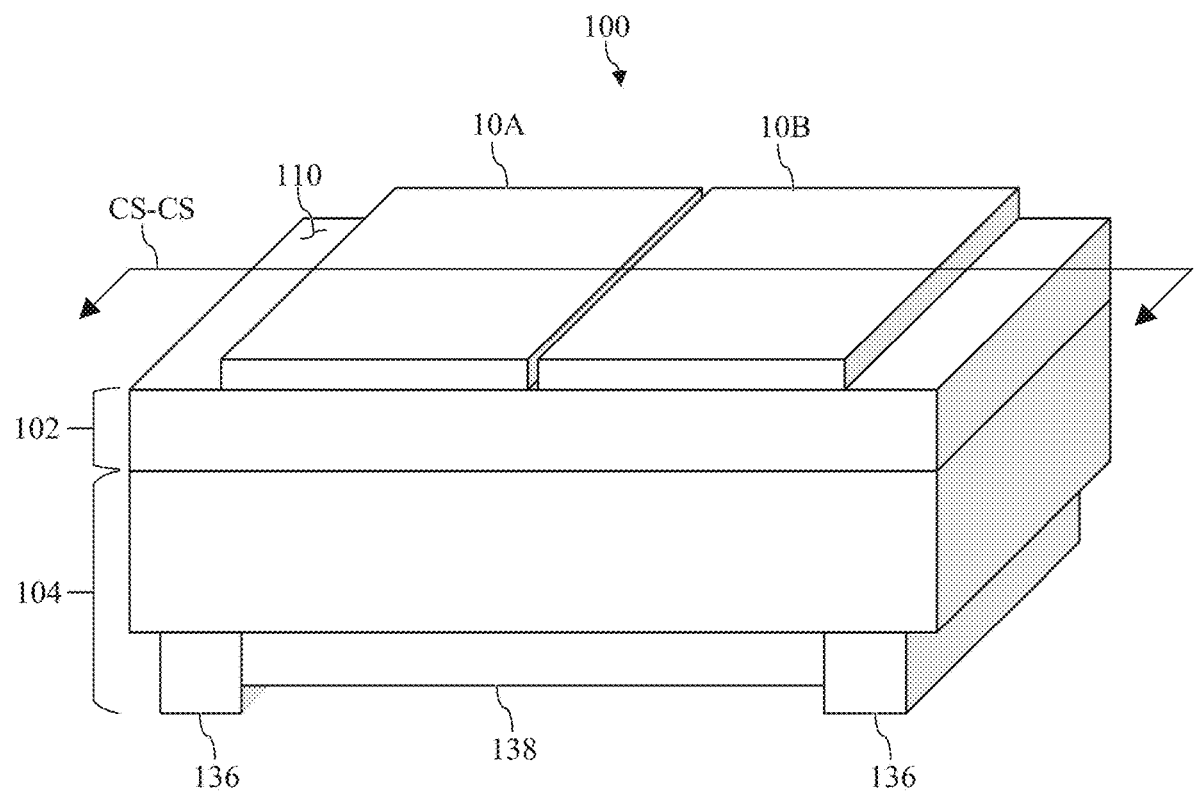
FIG. 13 depicts an isometric view of two packages and an embodiment of the fluid cooling system, according to embodiments of the disclosure.
Figure 14:
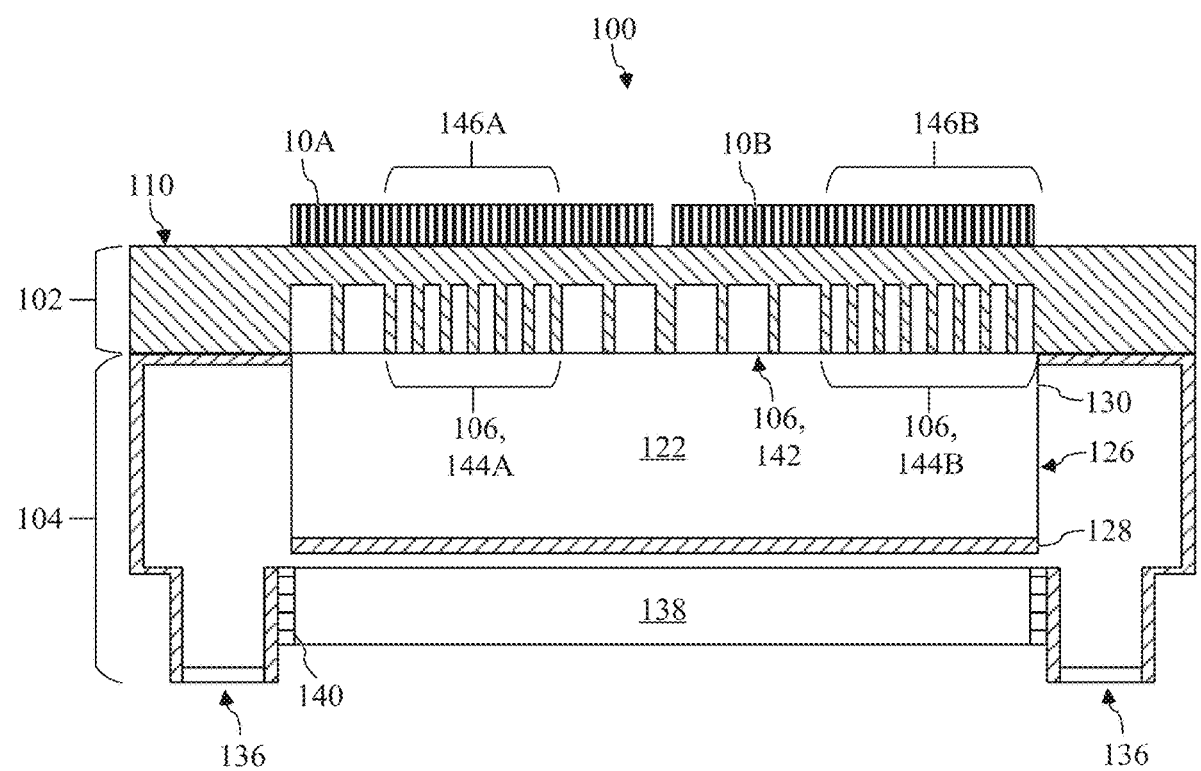
FIG. 14 depicts a front cross-sectional view of the two packages and fluid cooling system taken along line CS-CS of FIG. 13, according to embodiments of the disclosure.

FIGS. 13 and 14 show various views of fluid cooling system 100 and a plurality of packages 10A, 10B positioned thereon. Specifically, FIG. 13 shows a perspective view of fluid cooling system 100 including two packages 10A, 10B, and FIG. 14 shows a front cross-sectional view of fluid cooling system 100 and two packages 10A, 10B of FIG. 13. As shown in FIGS. 13 and 14, fluid cooling system 100 may be configured to receive and cool more than one heat-generating package 10A, 10B positioned on top surface 110 of top portion 102 during operation. The number of packages cooled by fluid cooling system 100 may be dependent upon, at least in part, the size of package(s) 10, the size of fluid cooling system 100, the heat generated by and/or predetermined cooling demand for each package(s) 10 cooled by system 100, and the like. It is understood that similarly numbered and/or named components may function in a substantially similar fashion. Redundant explanation of these components has been omitted for clarity.

As discussed herein, the size, dimensions, and/or spacing for embedded channels 106 formed in top portion 102 may not be uniform, patterned symmetrically, and/or may include a varied sizes/dimensions. In a non-limiting example shown in FIG. 14, embedded channels 106 of top portion 102 may include a first group 142 of embedded channels 106, each including a first width, and a second group 144 of embedded channels 106, each including a second width. The second width of each of the second group 144 of embedded channels 106 may be smaller than the first width of each of the first group 142 of embedded channels 106. The second/smaller width of the second group 144 of embedded channels 106 may provide a greater flow/pressure of cooling fluid within top portion 102 than the first group 142 of embedded channels 106. The greater flow/pressure of cooling fluid may result in increased cooling and/or heat dissipation from packages 10A, 10B positioned on cooling fluid system 100 during operation.

Additionally, the placement and/or formation of each of the groups 142, 144 of embedded channels 106 within top portion 102 may be predetermined and/or based, at least in part, on package 10A, 10B positioned on fluid cooling system 100. More specifically, the placement and/or formation each group 142, 144 of embedded channels 106 in predetermined portions of top portion 102 may be dependent on corresponding areas of package 10A, 10B that generate higher/lower heat and/or require more/less cooling. For example, first package 10A may include a high temperature region 146A that is centrally located on package 10A. As such, top portion 102 may include the first group 142 of embedded channels 106 positioned adjacent and/or substantially aligned with opposing, outer portions of package 10A (e.g., adjacent/offset from high temperature region 146A), while including the second group 144A of embedded channels 106 directly adjacent and aligned with high temperature region 146A. Additionally as shown in the non-limiting example of FIG. 14, second package 10B may include a high temperature region 146B that is offset from center and/or located on one half (e.g., right side) of package 10B. As a result, top portion 102 may include the second group 144 of embedded channels 106 positioned adjacent and/or substantially aligned with a distinct half (e.g., left side) of package 10A, and the second group 144B of embedded channels 106 directly adjacent and aligned with high temperature region 146B (e.g., right side). As discussed herein, the smaller width/size/dimension of the second group 144A, 144B of embedded channels 106 may provide a greater flow/pressure of cooling fluid, which in turn increases the cooling and/or heat dissipation from packages 10A, 10B.

Figure 15:
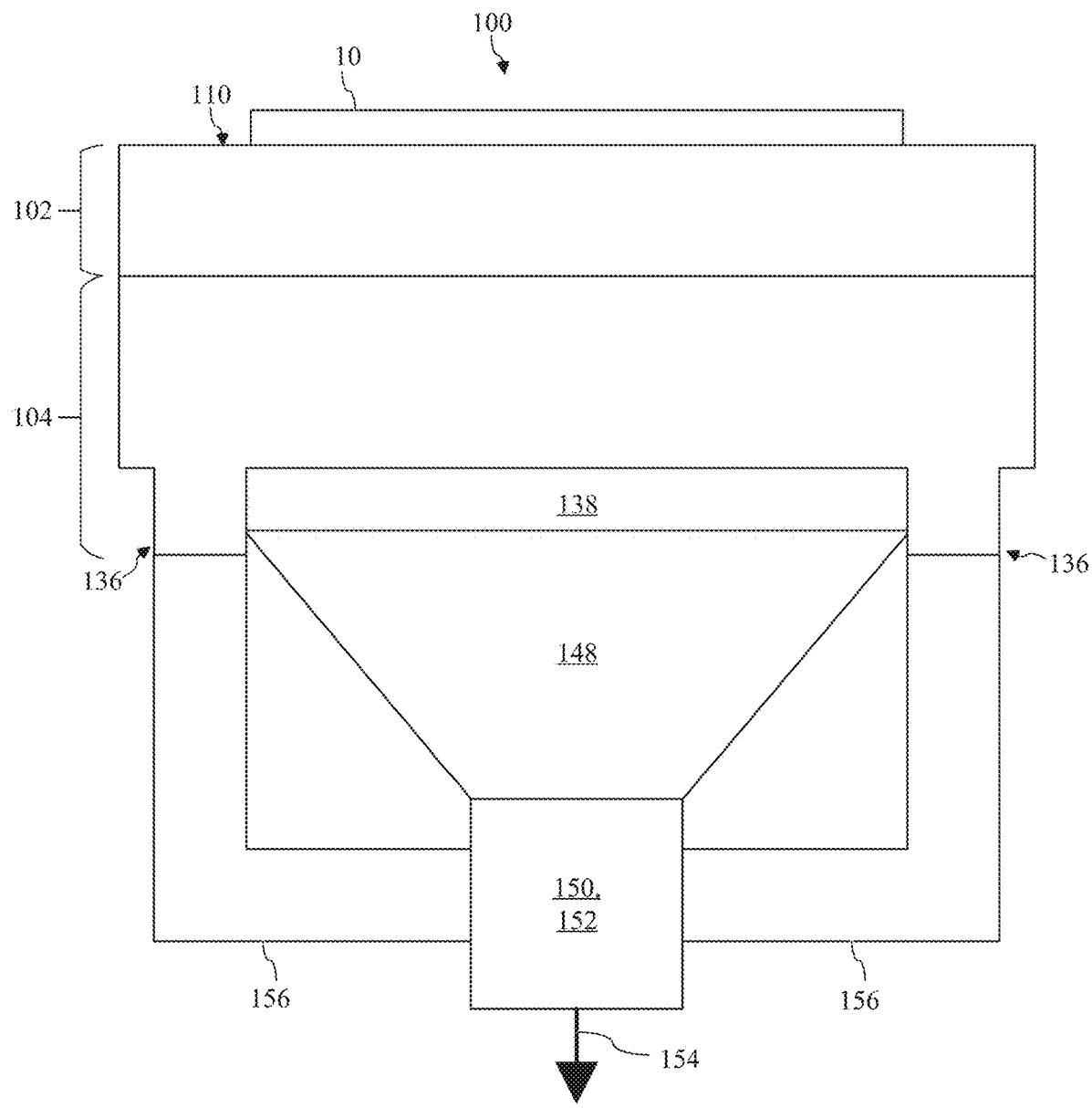
FIG. 15 shows a schematic view of an assembly including a fluid cooling system for cooling at least one heat generating package, according to embodiments of the disclosure.

Turning to FIG. 15, a schematic view of an assembly including a fluid cooling system 100 and package 10. In the non-limiting example, fluid cooling system 100 may also include a collection conduit 148 coupled to outlet section 138. More specifically, fluid cooling system 100 may include collection conduit 148 coupled to and in fluid communication with outlet section 138. Collection conduit 148 may receive the fluid from outlet section 138 that may be previously passed through top portion 102 and bottom portion 104 to cool package 10, as discussed herein. Although shown as two distinct components or portions, it is understood that collection conduit 148 may be formed integral with outlet section 138. In the non-limiting example, and as discussed herein, collection conduit 148 may collect the fluid discharged from outlet section 138 and may cycle the fluid back to bottom portion 104 via inlet sections 136 (via supply conduits 156).

In other non-limiting examples, and based on the characteristic of the heat exchange event within fluid cooling system 100 to cool package 10, fluid vapor or other gaseous by-products may be generated and discharged from outlet section 138, along with the fluid used to cool package 10, as discussed herein. In this non-limiting example, fluid cooling system 100 may include a condenser component 150 in direct fluid communication with outlet section 138/collection conduit 148. Condenser component 150 may receive the fluid and vapor from collection conduit 148 and condense the vapor and/or alter the state of the vapor back to a fluid (e.g., cooling fluid). Once condensed (and the fluid provided by collection conduit 148 is cooled), the fluid may be provided back to bottom portion 104 of fluid cooling system 100 via a plurality of supply conduits 156 in fluid communication and/or fluidly coupled to inlet section 136. In the non-limiting example shown in FIG. 15, condenser component 150 may also discharge any uncondensed vapor 154 into the ambient area surrounding of fluid cooling system 100 during operation.

In addition to condenser component 150, or alternatively where condenser component 150 is not needed during operation, fluid cooling system 100 may also include a cooling or heat exchanger component 152. As shown in FIG. 15, heat exchanger component 152 may be fluidly coupled to collection conduit 148 and supply conduits 156, respectively. Similar to condenser component 150, heat exchanger component 152 may receive fluid that may be previously passed through top portion 102 and bottom portion 104 to cool package 10, as discussed herein. Heat exchanger component 152 may then reduce the temperature of the fluid provided by collection conduit 148 prior to recirculating the fluid back to inlet section 136, via supply conduits 156. In the non-limiting example, heat exchanger component 152 may be any suitable component, device, and/or apparatus that may be configured to reduce the temperature of the fluid provided therein prior to recirculating the fluid within fluid cooling system 100.

With this new system, high temperature fluid will be constantly removed from the system and fresh cool fluid will constantly move into the channels 106 to remove more heat from the system. Based on the application and the amount of power generated, single-phase fluid cooling is ideal.

In one embodiment, the present disclosure allows for single-phase fluid cooling, herein sometimes referred to as "SLC." In a single-phase cooling, the coolant, i.e. water, does not undergo any phase changes during the cooling process. In other words, the coolant remains in its current, i.e. fluid, form.

SLIC is a method of cooling electrical components, devices, and sub-systems by fully immersing the device directly into a single-phase dielectric heat transfer fluid that is either passively circulated by the natural convection of the heated coolant or actively circulated by pumping the dielectric coolant in, through and around the electrical device being cooled, and then transferring the heat absorbed by the coolant to a heat rejection device such as a radiator, dry cooler, fluid-to-fluid heat exchanger, or cooling tower. In other words, thermal energy generated by a device is removed through absorption of that energy into a coolant and then transmission to a heat rejection device or heat reuse appliance.

A single-phase cooling loop consists of a pump, a heat exchanger (cold plate/mini- or micro-channels), and a heat sink (radiator with a fan or a fluid-to-fluid heat exchanger with chilled water cooling).

The present fluid cooling system 100, described therein, maximizes efficiency by allowing constant cooling in a system and by circulating constant cool coolant in the system than compared to cold plates and heat sinks alone. This new system is simple, cost-effective, efficient, and customizable depending on height and width requirements of a system. This new system has the ability to maximize cooling of microchips, microelectronics packages, and other heat generating electronics.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A fluid cooling system, comprising:
   a top portion including:
      a first surface receiving at least one package generating heat during operation,
      a second surface positioned opposite the first surface, and
      a plurality of embedded channels formed on the second surface; and
   a bottom portion positioned adjacent the top portion, the bottom portion including:
      at least one inlet section receiving a coolant,
      a plurality of inlet fluid conduits formed adjacent to and in fluid communication with the at least one inlet section,
      a plurality of outlet fluid conduits formed adjacent to the plurality of inlet fluid conduits, each of the plurality of outlet fluid conduits in fluid communication with at least one of the plurality of inlet fluid conduits, and
      at least one outlet section in fluid communication with the plurality of outlet fluid conduits and the at least one inlet section, the at least one inlet section including:
         a first inlet section positioned adjacent a first side of the bottom portion, and
         a second inlet section positioned adjacent a second side of the bottom portion, opposite the first inlet section,
         wherein each of the plurality of inlet fluid conduits extend between the first inlet section and the second inlet section.

2. The fluid cooling system of claim 1, wherein the plurality of inlet fluid conduits of the bottom portion extend perpendicular relative to the plurality of embedded channels formed in the top portion.

3. The fluid cooling system of claim 1, wherein the plurality of outlet fluid conduits of the bottom portion extend perpendicular relative to the second surface of the top portion.

4. The fluid cooling system of claim 1, wherein the top portion is coupled to the bottom portion.

5. The fluid cooling system of claim 1, wherein the top portion and the bottom portion integrally form a single, continuous body.

6. The fluid cooling system of claim 1, wherein a first embedded channel of the plurality of channels includes a first dimension, and a second embedded channel of the plurality of channels includes a second dimension, distinct from the first dimension of the first embedded channel.

7. The fluid cooling system of claim 1, wherein the at least one inlet section includes:
   a first inlet section positioned adjacent a first side of the bottom portion, and
   a second inlet section positioned adjacent a second side of the bottom portion, opposite the first inlet section.

8. The fluid cooling system of claim 1, wherein each of the plurality of outlet fluid conduits is positioned between two adjacent inlet fluid conduits of the plurality of inlet fluid conduits.

9. The fluid cooling system of claim 1, wherein the bottom portion further comprises at least one barrier extending between and separating the at least one inlet section and the at least one outlet section.

10. The fluid cooling system of claim 1, wherein the bottom portion further comprises:
    a plurality of cold plates extending adjacent to the at least one inlet section, each cold plate of the plurality of cold plates at least partially defining one of the plurality of inlet fluid conduits.

11. The fluid cooling system of claim 10, wherein each of the plurality of cold plates are separated by a predetermined distance, and wherein each of the plurality of outlet fluid conduits are at least partially defined in a space formed between two, separated cold plates of the plurality of cold plates.

12. The fluid cooling system of claim 10, wherein each of the plurality of cold plates contact at least one embedded channel of the top portion.

13. The fluid cooling system of claim 1, further comprising at least one of:
    a condenser component fluidly coupled to the at least one inlet section and the at least one outlet section of the bottom portion, or a heat exchanger component fluidly coupled to the at least one inlet section and the at least one outlet section of the bottom portion.

14. A fluid cooling system, comprising:
    a top portion including:
       a first surface receiving at least one package generating heat during operation,
       a second surface positioned opposite the first surface, and
       a plurality of embedded channels formed on the second surface; and
    a bottom portion positioned adjacent the top portion, the bottom portion including:
       at least one inlet section receiving a coolant,
       a plurality of inlet fluid conduits formed adjacent to and in fluid communication with the at least one inlet section,
       a plurality of outlet fluid conduits formed adjacent to the plurality of inlet fluid conduits, each of the plurality of outlet fluid conduits in fluid communication with at least one of the plurality of inlet fluid conduits, and
       at least one outlet section in fluid communication with the plurality of outlet fluid conduits and the at least one inlet section, wherein the at least one inlet section includes:
          a first inlet section positioned adjacent a first side of the bottom portion, and
          a second inlet section positioned adjacent a second side of the bottom portion, opposite the first inlet section,
          wherein each of the plurality of outlet fluid conduits extend between the first inlet section and the second inlet section.

15. The fluid cooling system of claim 14, wherein the plurality of inlet fluid conduits of the bottom portion extend perpendicular relative to the plurality of embedded channels formed in the top portion.

16. The fluid cooling system of claim 14, wherein the plurality of outlet fluid conduits of the bottom portion extend perpendicular relative to the second surface of the top portion.

17. The fluid cooling system of claim 14, wherein the top portion is coupled to the bottom portion.

18. A fluid cooling system, comprising:
a top portion including:
a first surface receiving at least one package generating heat during operation,
a second surface positioned opposite the first surface, and
a plurality of embedded channels formed on the second surface; and
a bottom portion positioned adjacent the top portion, the bottom portion including:
at least one inlet section receiving a coolant,
a plurality of inlet fluid conduits formed adjacent to and in fluid communication with the at least one inlet section,
a plurality of outlet fluid conduits formed adjacent to the plurality of inlet fluid conduits, each of the plurality of outlet fluid conduits in fluid communication with at least one of the plurality of inlet fluid conduits, and
at least one outlet section in fluid communication with the plurality of outlet fluid conduits and the at least one inlet section,
wherein the bottom portion further comprises:
a plurality of cold plates extending adjacent to the at least one inlet section, each cold plate of the plurality of cold plates at least partially defining one of the plurality of inlet fluid conduits, and
wherein each of the plurality of cold plates includes a base, and two opposing sidewalls extending substantially perpendicular to the base.

19. The fluid cooling system of claim 18, wherein the plurality of inlet fluid conduits of the bottom portion extend perpendicular relative to the plurality of embedded channels formed in the top portion.

20. The fluid cooling system of claim 18, wherein the plurality of outlet fluid conduits of the bottom portion extend perpendicular relative to the second surface of the top portion.

* * * * *